United States Patent
Hsu et al.

(10) Patent No.: US 11,348,502 B2
(45) Date of Patent: May 31, 2022

(54) DRIVE CIRCUIT AND TOUCH GATE DRIVE CIRCUIT

(71) Applicants: AU Optronics (Kunshan) Co., Ltd., Kunshan (CN); AU OPTRONICS CORPORATION, Hsin-Chu (TW)

(72) Inventors: Tsi-Hsuan Hsu, Kunshan (CN); Manman Li, Kunshan (CN); Chun-Da Tu, Kunshan (CN); Fu Liang Lin, Kunshan (CN)

(73) Assignees: AU OPTRONICS (KUNSHAN) CO., LTD., Kunshan (CN); AU OPTRONICS CORPORATION, Hsin-Chu (TW)

( * ) Notice: Subject to any disclaimer, the term of this patent is extended or adjusted under 35 U.S.C. 154(b) by 143 days.

(21) Appl. No.: 16/765,589

(22) PCT Filed: Dec. 26, 2018

(86) PCT No.: PCT/CN2018/123926
§ 371 (c)(1),
(2) Date: May 20, 2020

(87) PCT Pub. No.: WO2020/132950
PCT Pub. Date: Jul. 2, 2020

(65) Prior Publication Data
US 2021/0225237 A1    Jul. 22, 2021

(30) Foreign Application Priority Data
Dec. 25, 2018    (CN) .......................... 201811597926.8

(51) Int. Cl.
*G09G 3/20*    (2006.01)
*G06F 3/041*    (2006.01)

(52) U.S. Cl.
CPC ............. *G09G 3/20* (2013.01); *G06F 3/0412* (2013.01); *G06F 3/0416* (2013.01); *G09G 2310/0286* (2013.01)

(58) Field of Classification Search
CPC .......... G09G 3/20; G09G 3/36; G09G 3/3677; G09G 2310/0286; G06F 3/0412;
(Continued)

(56) References Cited

U.S. PATENT DOCUMENTS 8,493,131 B2 *    7/2013    Mo ..................... G06F 3/04166
                                                                327/530
9,207,797 B2 *   12/2015    Konicek ............... G06F 3/0443
(Continued)

FOREIGN PATENT DOCUMENTS

CN    103366822 A    10/2013
CN    105513530 A    4/2016

*Primary Examiner* — Ryan A Lubit
(74) *Attorney, Agent, or Firm* — WPAT, PC

(57) ABSTRACT

The present invention of the embodiment provides a drive circuit, comprising a first group of drive circuits and a second group of drive circuits each having multiple stages of gate drive circuits connected in series, each stage of the gate drive circuits comprising a shift register outputting a first gate drive signal and a touch voltage stabilizing unit coupled to the shift register, the touch voltage stabilizing unit comprising a reference end electrically connected to a reference potential of the shift register, a first voltage stabilizing end electrically connected to the first gate drive signal, a second voltage stabilizing end outputting a second gate drive signal and a signal end electrically connected to a control signal, wherein the control signal disables the touch voltage stabilizing unit during a display period, and the control signal enables the touch voltage stabilizing unit during a touch period.

15 Claims, 5 Drawing Sheets

(58) Field of Classification Search
CPC .... G06F 3/0416; G06F 3/041; G06F 3/04166; G11C 19/28
See application file for complete search history.

(56) References Cited

U.S. PATENT DOCUMENTS

| | | |
|---|---|---|
| 9,459,730 B2 | 10/2016 | Long et al. |
| 9,588,617 B2 | 3/2017 | Chae |
| 2012/0105338 A1* | 5/2012 | Lin .................. G11C 19/28 377/79 |
| 2014/0219412 A1* | 8/2014 | Chien ............... G11C 19/28 377/68 |
| 2015/0054763 A1 | 2/2015 | Yang et al. |
| 2015/0205427 A1* | 7/2015 | Wu .................. G06F 3/0446 345/174 |
| 2017/0032752 A1* | 2/2017 | Huang .............. G11C 19/28 |
| 2017/0124976 A1* | 5/2017 | Chen ............... G09G 3/3677 |
| 2017/0186361 A1* | 6/2017 | Lin ................. G11C 19/184 |
| 2018/0047341 A1* | 2/2018 | Ma .................. G09G 3/36 |
| 2019/0164514 A1* | 5/2019 | Gong ............... G06F 3/0412 |
| 2021/0335301 A1* | 10/2021 | Liang .............. G09G 3/3648 |

* cited by examiner

DRIVE CIRCUIT AND TOUCH GATE DRIVE CIRCUIT

TECHNICAL FIELD

The disclosure relates to a drive circuit, and particularly to a touch gate drive circuit for a touch display device.

BACKGROUND ART

Generally, a gate drive circuit in a display device is composed of multiple stages of shift registers connected in series, and each stage of the shift register outputs a gate drive signal to turn on a corresponding pixel row, such that the display data can be written into each pixel of the pixel row. However, the traditional gate drive circuit is typically configured as a single driven circuit on both sides. In a touch state, a touch voltage stabilizing transistor in the gate drive circuit is turned on to stabilize a scanning signal of a gate line. Due to the configuration of single drive, the effect of stabilizing the scanning signal proximate to the gate drive circuit is great, and the scanning signal far away from the gate drive circuit is affected by the touch signal and a coupling between the scanning signal and the touch signal is significant, such that horizontal stripes having alternate dark and bright patterns may occur on both sides of the display panel. Therefore, an important object is to solve this problem.

DISCLOSURE OF THE PRESENT INVENTION

The present invention of the embodiment provides a drive circuit and a touch gate drive circuit, which can stabilize the scanning signal far away from the drive circuit and prevent horizontal stripes having alternate dark and bright patterns from occurring on both sides of the display panel, such that the touch display is much more stable, the display quality is improved, and the stability of the product is enhanced.

A drive circuit according to one embodiment of the present invention comprises a first group of drive circuits and a second group of drive circuits each comprising multiple stages of gate drive circuits connected in series, each stage of the gate drive circuits comprising a shift register outputting a first gate drive signal and a touch voltage stabilizing unit coupled to the shift register, wherein the touch voltage stabilizing unit comprises a reference end electrically connected to a reference potential of the shift register, a first voltage stabilizing end electrically connected to the first gate drive signal, a second voltage stabilizing end outputting a second gate drive signal and a signal end electrically connected to a control signal, wherein, the control signal disables the touch voltage stabilizing unit during a display period, and the control signal enables the touch voltage stabilizing unit during a touch period.

A touch gate drive circuit according to one embodiment of the present invention comprises a first shift register and a second shift register each having a gate drive signal output end; and a touch voltage stabilizing unit having a first touch voltage stabilizing unit coupled to the gate drive signal output end of the second shift register and a second touch voltage stabilizing unit coupled to the gate drive signal output end of the first shift register.

The following advantageous effects can be achieved by using the printed circuit board and the wiring according to the present invention.

Hereinafter, the present invention will be explicitly described with reference to accompanying drawings and detailed embodiments; however, the present invention is not limited thereto.

Figure 1A:
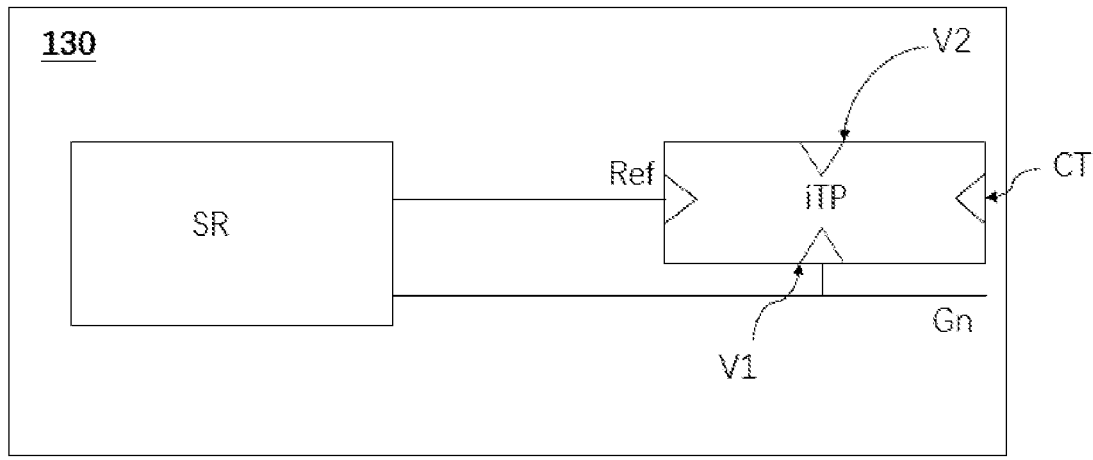
FIG. 1A is a diagram showing a structure of a gate drive circuit according to one embodiment of the present invention.

In the drawings, the reference signs are:
100, 200: drive circuit
110, 210: a first group of drive circuit
120, 220: a second group of drive circuit
130-1~130-8, 130: gate drive circuit
SR, SR1~SR8: shift register
iTP, iTP1~iTP8: touch voltage stabilizing unit
iTP-1: first voltage stabilizing unit
iTP-2: second voltage stabilizing unit
T1, T2: thin film transistor
Ref: reference end
V1: first voltage stabilizing end
V2: second voltage stabilizing end
CT: signal end
G1~G8, Gn, Gn−1, Gn+1: gate drive signal
CK: clock pulse signal
XDONB: reference potential

DETAILED DESCRIPTION OF THE EXEMPLARY EMBODIMENTS

Hereinafter, the principles of structure and operation of the present invention will be specifically described with reference to the accompanying drawings.

Figure 1B:
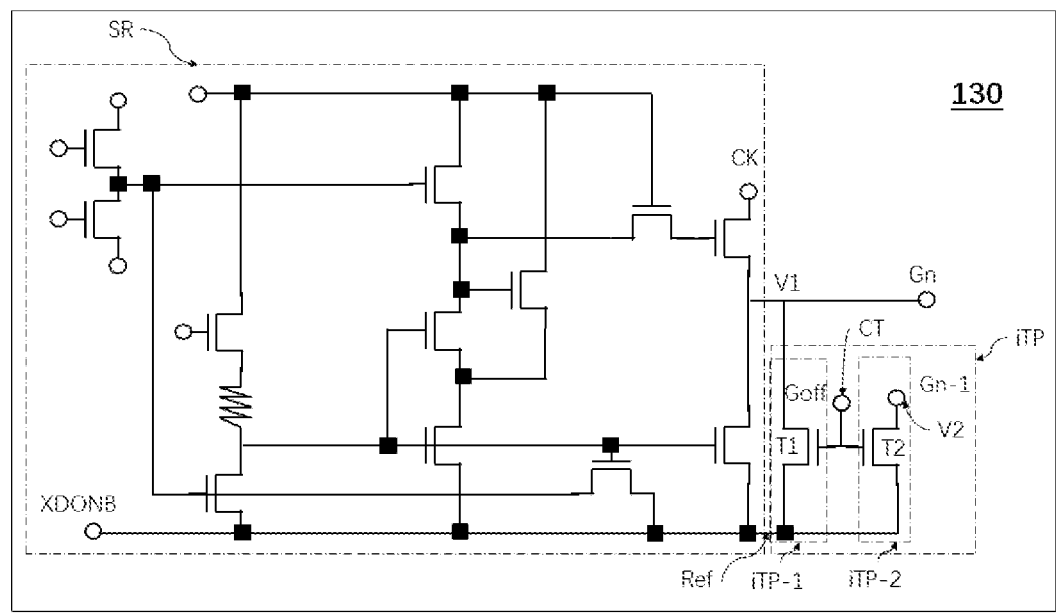
FIG. 1B is a diagram showing a circuit structure of the gate drive circuit according to one embodiment of the present invention.

FIG. 1A is a diagram showing a structure of a gate drive circuit according to one embodiment of the present invention. FIG. 1B is a diagram showing a circuit structure of the gate drive circuit according to one embodiment of the present invention. As shown in FIGS. 1A and 1B, the gate drive circuit 130 comprises a shift register SR and a touch voltage stabilizing unit iTP connected to the shift register SR in series. Each touch voltage stabilizing unit iTP comprises a first voltage stabilizing unit iTP-1 and a second voltage stabilizing unit iTP-2. The shift register SR can be any type of shift register known in the art, and the details thereof are not provided.

Specifically, the touch voltage stabilizing unit iTP comprises a reference end Ref, a first voltage stabilizing end V1, a second voltage stabilizing end V2 and a signal end CT. The shift register SR outputs a reference potential XDONB to the touch voltage stabilizing unit iTP, and generates a gate drive signal Gn. The first voltage stabilizing unit iTP-1 and the second voltage stabilizing unit iTP-2 of the touch voltage stabilizing unit iTP each has a first end, a second end and a control end. When the first voltage stabilizing unit iTP-1 and the second voltage stabilizing unit iTP-2 are formed of, for example, N-type thin film transistors T1 and T2, source electrodes of the thin film transistors T1 and T2 correspond to the first ends of the first voltage stabilizing unit iTP-1 and the second voltage stabilizing unit iTP-2, respectively, drain electrodes of the thin film transistors T1 and T2 correspond to the second ends of the first voltage stabilizing unit iTP-1 and the second voltage stabilizing unit iTP-2, respectively, and gate electrodes of the thin film transistors T1 and T2 correspond to the control ends of the first voltage stabilizing unit iTP-1 and the second voltage stabilizing unit iTP-2, respectively. However, the present invention is not limited thereto, and other voltage stabilizing and/or switching elements can be applied depending on the requirement of manufacturing process or driving.

Specifically, as shown in FIG. 1B, the source electrodes of the thin film transistors T1 and T2 are connected in parallel to form the reference end Ref of the touch voltage stabilizing unit iTP, and are electrically connected to the reference potential XDONB of the shift register SR. The drain electrode of the thin film transistor T1 forms the first voltage stabilizing end V1 of the touch voltage stabilizing unit iTP and is electrically connected to a first gate drive signal Gn outputted from the shift register SR to stabilize the first gate drive signal Gn. The drain electrode of the thin film transistor T2 forms the second voltage stabilizing end V2 of the touch voltage stabilizing unit iTP and is electrically connected to a second gate drive signal Gn-1 outputted from another shift register SR to stabilize the second gate drive signal Gn-1. The gate electrodes of the thin film transistors T1 and T2 are connected in parallel to form the signal end CT of the touch voltage stabilizing unit iTP, and are electrically connected to a control signal Goff.

Figure 1C:
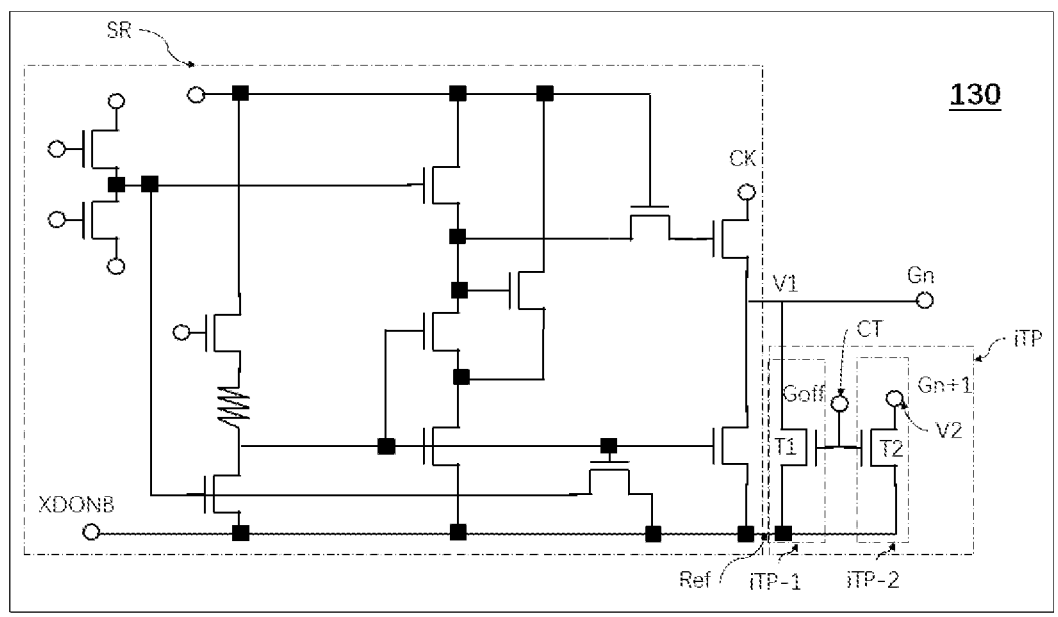
FIG. 1C is a diagram showing a circuit structure of the gate drive circuit according to another embodiment of the present invention.

FIG. 1C is a diagram showing a circuit structure of the gate drive circuit according to another embodiment of the present invention. As shown in FIG. 1C, the gate drive circuit 130 according to this embodiment differs from the gate drive circuit 130 shown in FIG. 1B only in that the drain electrode of the thin film transistor T2 in the gate drive circuit 130 according to the embodiment shown in FIG. 1C is electrically connected to a second gate drive signal Gn+1 of another shift register SR to stabilize the second gate drive signal Gn+1, and the other circuit configurations are same as those of the gate drive circuit 130 shown in FIG. 1B.

Figure 2A:
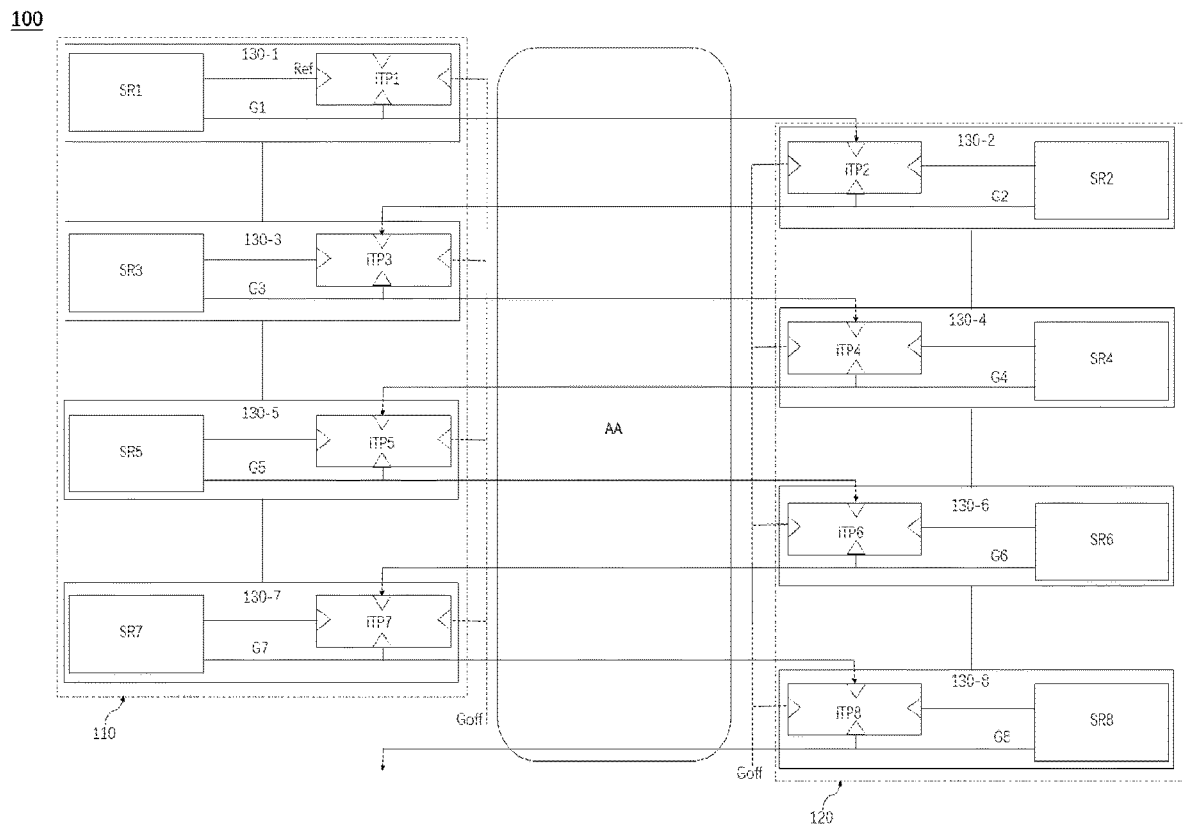
FIG. 2A is a diagram showing a structure of a drive circuit according to one embodiment of the present invention.

FIG. 2A is a diagram showing a structure of a drive circuit according to one embodiment of the present invention. As shown in FIGS. 1B and 2A, in this embodiment, the drive circuit 100 is divided into a first group of drive circuits 110 and a second group of drive circuits 120 disposed on both sides of a display region AA, respectively, to drive the display region AA. The first group of drive circuits 110 comprises multiple stages of gate drive circuits 130-1, 130-3, 130-5, 130-7 . . . , the second group of drive circuits 120 comprises multiple stages of gate drive circuits 130-2, 130-4, 130-6, 130-8 . . . , the multiple stages of gate drive circuits 130-1, 130-3, 130-5, 130-7 . . . are connected in series, and the multiple stages of stages of gate drive circuits 130-2, 130-4, 130-6, 130-8 . . . are connected in series. Each stage of the gate drive circuits has the structure of the gate drive circuit shown in FIG. 1B.

Taking the gate drive circuits 130-1, 130-3 in the first group of drive circuits 110 and the gate drive circuits 130-2, 130-4 in the second group of drive circuits 120 for example, in this embodiment, the gate drive circuits 130-1, 130-3 comprise the shift registers SR1, SR3 and the touch voltage stabilizing units iTP1, iTP3, and the gate drive circuits 130-2, 130-4 comprise the shift registers SR2, SR4 and the touch voltage stabilizing units iTP2, iTP4. The shift register SR1 of the gate drive circuit 130-1 outputs a first gate drive signal G1 and is coupled to the display region AA. The first gate drive signal G1 is electrically connected to the first voltage stabilizing end V1 of the touch voltage stabilizing unit iTP1 before passing through the display region AA, to stabilize the first gate drive signal G1 on a left side of the display region AA (i.e., proximate to the gate drive circuit 130-1). The first gate drive signal G1 is connected to the second voltage stabilizing end V2 of the gate drive circuit 130-2 after passing through the display region AA, to stabilize the first gate drive signal G1 on a right side of the display region AA (i.e., far away from the gate drive circuit 130-1), such that a stabilized second gate drive signal is supplied to the display region AA. Similarly, the shift register SR2 of the gate drive circuit 130-2 outputs a first gate drive signal G2 and is coupled to the display region AA. The first gate drive signal G2 is electrically connected to the first voltage stabilizing end V1 of the touch voltage stabilizing unit iTP2 before passing through the display region AA, to stabilize the first gate drive signal G2 on the right side of the display region AA (i.e., proximate to the gate drive circuit 130-2). The first gate drive signal G2 is connected to the second voltage stabilizing end V2 of the gate drive circuit 130-3 after passing through the display region AA, to stabilize the first gate drive signal G2 on the left side of the display region AA (i.e., far away from the gate drive circuit 130-2), such that a stabilized second gate drive signal is supplied to the display region AA.

Similarly, each of the gate drive signals G1, G3, G5, G7 . . . outputted from the first group of drive circuits 110 is connected to the first voltage stabilizing end V1 of the gate drive circuit 130-1, 130-3, 130-5, 130-7 . . . generating the corresponding gate drive signal before passing through the display region AA, and each of the gate drive signals G1, G3, G5, G7 . . . outputted from the first group of drive circuits 110 is connected to the second voltage stabilizing end V2 of the respective gate drive circuit 130-2, 130-4, 130-6, 130-8 . . . of the second group of drive circuits 120 after passing through the display region AA. Each of the gate drive signals G2, G4, G6, G8 . . . outputted from the second group of drive circuits 120 is connected to the first voltage stabilizing end V1 of the gate drive circuit 130-2, 130-4, 130-6, 130-8 . . . generating the corresponding gate drive signal before passing through the display region AA, and each of the gate drive signals G2, G4, G6, G8 . . . outputted from the second group of drive circuits 120 is connected to the second voltage stabilizing end V2 of the respective gate drive circuit 130-1, 130-3, 130-5, 130-7 . . . of the first group of drive circuits 110 after passing through the display region AA. Therefore, each of the gate drive signals G1, G3, G5, G7 . . . of the first group of drive circuits 110 is stabilized by the touch voltage stabilizing unit of the first group of drive circuits 110 on the left side of the display region AA (proximate to the gate drive circuit), and is stabilized by the touch voltage stabilizing unit of the second group of drive circuits 120 on the right side of the display region AA (far away from the gate drive circuit). Each of the gate drive signals of the second group of drive circuits 120 is stabilized by the touch voltage stabilizing unit of the second group of drive circuits 120 on the right side of the display region AA (proximate to the gate drive circuit), and is stabilized by the touch voltage stabilizing unit of the first group of drive circuits 110 on the left side of the display region AA (far away from the gate drive circuit). Accordingly, it is possible to stabilize the scanning signals far away from the gate drive circuit and prevent the horizontal stripes having alternate dark and bright patterns from occurring on both sides of the display panel.

Figure 2B:
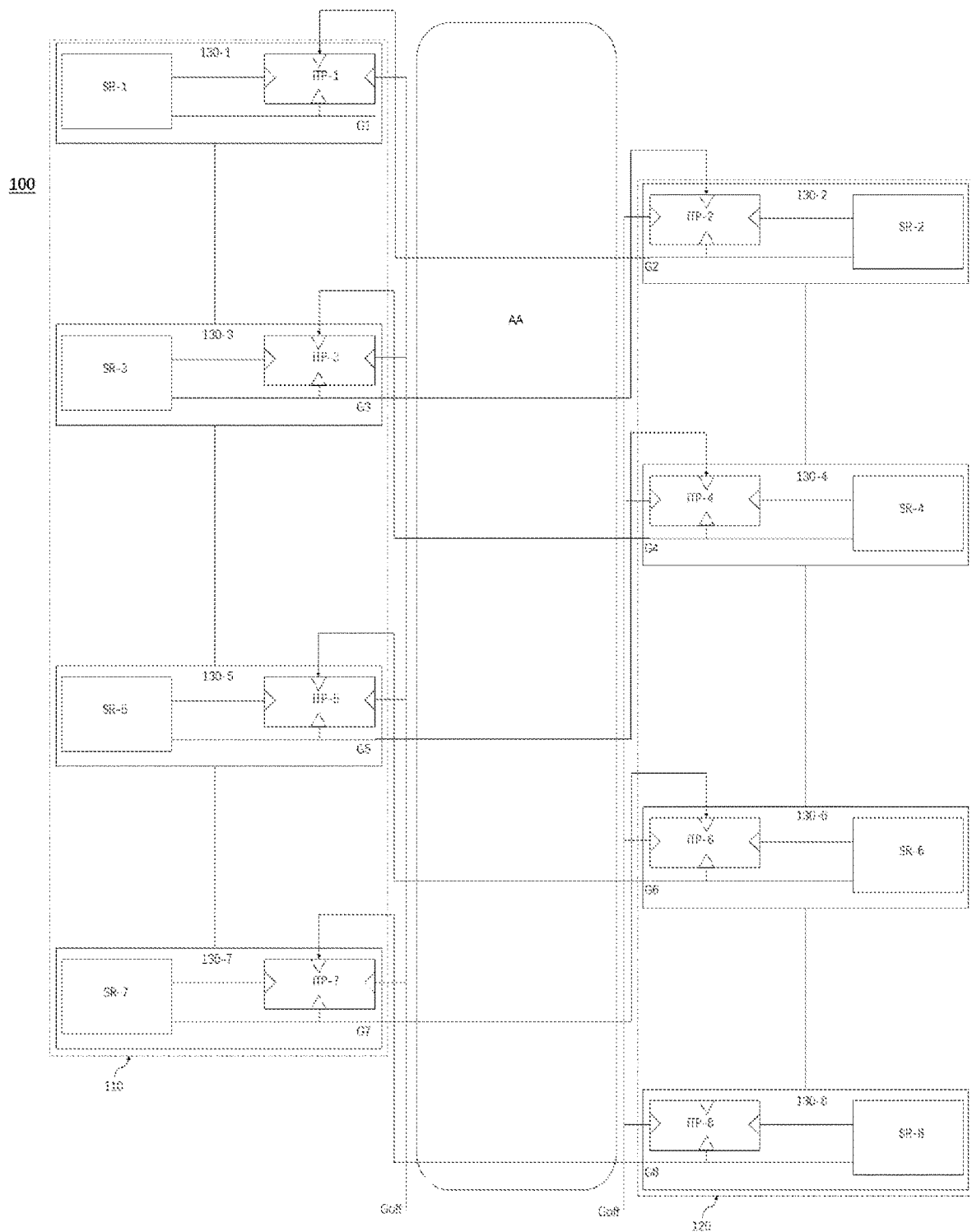
FIG. 2B is a diagram showing a structure of a drive circuit according to another embodiment of the present invention.

FIG. 2B is a diagram showing a structure of a drive circuit according to another embodiment of the present invention. As shown in FIGS. 1C and 2B, in this embodiment, the drive circuit 100 is divided into a first group of drive circuits 110 and a second group of drive circuits 120 disposed on both sides of the display region AA, respectively, to drive the display region AA. The first group of drive circuits 110 comprises multiple stages of gate drive circuits 130-1, 130-3, 130-5, 130-7 . . . , the second group of drive circuits 120 comprises multiple stages of gate drive circuits 130-2, 130-4, 130-6, 130-8 . . . , the multiple stages of gate drive circuits 130-1, 130-3, 130-5, 130-7 . . . are connected in series, and the multiple stages of gate drive circuits 130-2, 130-4, 130-6, 130-8 . . . are connected in series. Each stage of the gate drive circuits has the structure of the gate drive circuit shown in FIG. 1C.

Taking the gate drive circuits 130-1, 130-3 in the first group of drive circuits 110 and the gate drive circuits 130-2, 130-4 in the second group of drive circuits 120 for example, in this embodiment, the gate drive circuits 130-1, 130-3 comprise shift registers SR1, SR3 and touch voltage stabilizing units iTP1, iTP3, and the gate drive circuits 130-2, 130-4 comprise shift registers SR2, SR4 and touch voltage stabilizing units iTP2, iTP4. The shift register SR3 of the gate drive circuit 130-3 outputs a first gate drive signal G3 and is coupled to the display region AA. The first gate drive signal G3 is electrically connected to the first voltage stabilizing end V1 of the touch voltage stabilizing unit iTP3 before passing through the display region AA, to stabilize the first gate drive signal G3 on a left side of the display region AA (i.e., proximate to the gate drive circuit 130-3). The first gate drive signal G3 is connected to the second voltage stabilizing end V2 of the gate drive circuit 130-2 after passing through the display region AA, to stabilize the first gate drive signal G3 on a right side of the display region AA (i.e., far away from the gate drive circuit 130-3), such that a stabilized second gate drive signal is supplied to the display region AA. Similarly, the shift register SR2 of the gate drive circuit 130-2 outputs a first gate drive signal G2 and is coupled to the display region AA. The first gate drive signal G2 is electrically connected to the first voltage stabilizing end V1 of the touch voltage stabilizing unit iTP2 before passing through the display region AA, to stabilize the first gate drive signal G2 on a right side of the display region AA (i.e., proximate to the gate drive circuit 130-2). The first gate drive signal G2 is connected to the second voltage stabilizing end V2 of the gate drive circuit 130-1 after passing through the display region AA, to stabilize the first gate drive signal G2 on a left side of the display region AA (i.e., far away from the gate drive circuit 130-2), such that a stabilized second gate drive signal is supplied to the display region AA.

Similarly, each of the gate drive signals G1, G3, G5, G7 . . . outputted from the first group of drive circuits 110 is connected to the first voltage stabilizing end V1 of the gate drive circuit 130-1, 130-3, 130-5, 130-7 . . . generating the corresponding gate drive signal before passing through the display region AA, and each of the gate drive signals G3, G5, G7 . . . outputted from the first group of drive circuits 110 is connected to the second voltage stabilizing end V2 of the respective gate drive circuit 130-2, 130-4, 130-6, 130-8 . . . of the second group of drive circuits 120 after passing through the display region AA. Each of the gate drive signals G2, G4, G6, G8 . . . outputted from the second group of drive circuits 120 is connected to the first voltage stabilizing end V1 of the gate drive circuit 130-2, 130-4, 130-6, 130-8 . . . generating the corresponding gate drive signal before passing through the display region AA, and each of the gate drive signals G2, G4, G6, G8 . . . outputted from the second group of drive circuits 120 is connected to the second voltage stabilizing end V2 of the respective gate drive circuit 130-1, 130-3, 130-5, 130-7 . . . of the first group of drive circuits 110 after passing through the display region AA.

Therefore, each of the gate drive signals G3, G5, G7 . . . of the first group of drive circuits 110 is stabilized by the touch voltage stabilizing unit of the first group of drive circuits 110 on the left side of the display region AA (proximate to the gate drive circuit), and is stabilized by the touch voltage stabilizing unit of the second group of drive circuits 120 on the right side of the display region AA (far away from the gate drive circuit). Each of the gate drive signals of the second group of drive circuits 120 is stabilized by the touch voltage stabilizing unit of the second group of drive circuits 120 on the right side of the display region AA (proximate to the gate drive circuit), and is stabilized by the touch voltage stabilizing unit of the first group of drive circuits 110 on the left side of the display region AA (far away from the gate drive circuit). Accordingly, it is possible to stabilize the scanning signals far away from the gate drive circuit and prevent the horizontal stripes having alternate dark and bright patterns from occurring on both sides of the display panel.

In the drive circuit of the present invention, the control signal Goff disables the touch voltage stabilizing unit iTP during a display period to ensure normal display of the display region AA, and the control signal Goff enables the touch voltage stabilizing unit iTP during a touch period to stabilize the gate drive signals generated by the gate drive circuits. Specifically, when the first voltage stabilizing unit iTP-1 and the second voltage stabilizing unit iTP-2 of the touch voltage stabilizing unit iTP are formed of, for example, N-type thin film transistors T1, T2, the control signal Goff has a low level and disables the first voltage stabilizing unit iTP-1 and the second voltage stabilizing unit iTP-2 during the display period, and the control signal Goff has a high level and enables the first voltage stabilizing unit iTP-1 and the second voltage stabilizing unit iTP-2 during the touch period, such that the gate drive signals on the display region AA proximate to the drive circuit is stabilized by the first voltage stabilizing unit iTP-1, and the gate drive signals on the display region AA far away from the drive circuit is stabilized by the second voltage stabilizing unit iTP-2. Similarly, when, for example, the P-type thin film transistor is used, the enable signal has a low level, and the disable signal has a high level.

In addition, the shift register SR receives a clock pulse signal CK indicating a state of the display region AA. When the state of the display region AA is a display state, the clock pulse signal CK is an AC signal, and when the state of the display region AA is a touch state, the clock pulse signal CK is a DC signal. Therefore, the control signal Goff can depend on the state of the clock pulse signal CK. When the clock pulse signal CK is the AC signal, which indicates that the state of display region AA is the display state, the control signal Goff is set to have a potential capable of turning on the thin film transistors T1, T2. When the clock pulse signal CK is the DC signal, which indicates that state of the display region AA is the touch state, the control signal Goff can be set to have a potential capable of turning off the thin film transistors T1, T2.

Figure 3A:
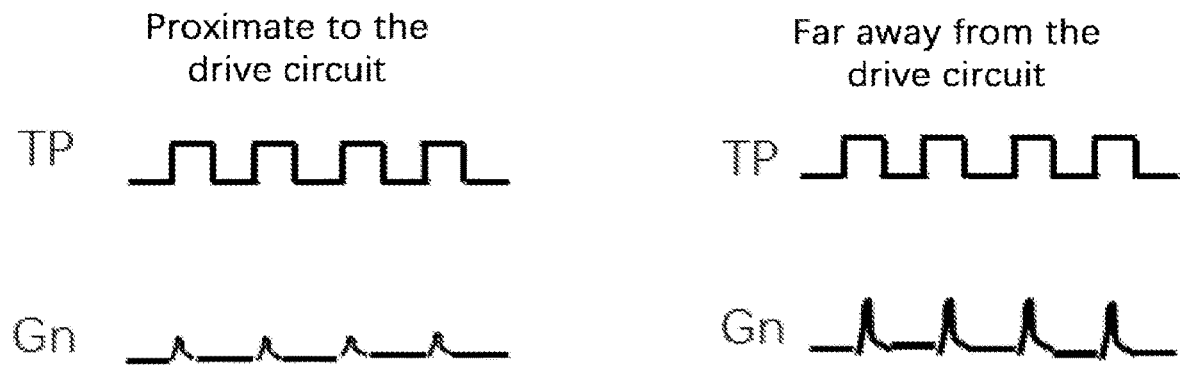
FIG. 3A is a diagram showing a signal waveform without using the drive circuit of the present invention.
Figure 3B:
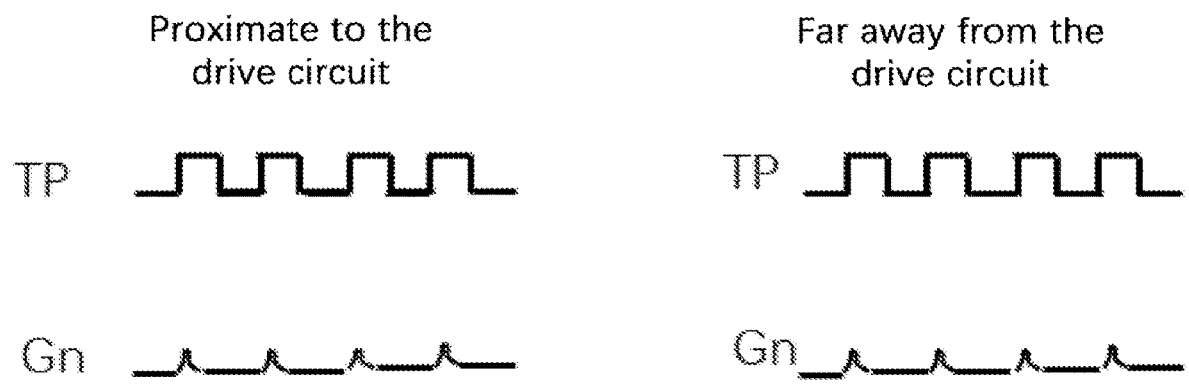
FIG. 3B is a diagram showing a signal waveform using the drive circuit of the present invention.

FIG. 3A is a diagram showing a signal waveform without using the drive circuit of the present invention. FIG. 3B is a diagram showing a signal waveform using the drive circuit of the present invention. As shown in FIG. 3A, when the drive circuit of the present invention is not used, in the touch state, the gate drive signal Gn on the display region proximate to the drive circuit is less affected by the touch control signal TP on a trace line, and the gate drive signal Gn on the display region far away from the drive circuit is much affected by the touch control signal TP on the trace line. As shown in FIG. 3B, when the drive circuit of the present invention is used, in the touch state, the gate drive signal Gn on the display region proximate to the drive circuit is less affected by the touch control signal TP on a trace line, and meanwhile the gate drive signal Gn on the display region far away from the drive circuit is less affected by the touch control signal TP on a trace line due to the touch voltage stabilizing unit. Accordingly, it is possible to stabilize the gate drive signals and prevent the horizontal stripes having alternate dark and bright patterns from occurring on both sides of the display panel.

Despite above, the present invention of the embodiments further have several other embodiments, and those skilled in the art make various modifications and variations to the present invention without departing from the spirit and essence of the present invention. These modifications and variations shall belong to the protection scope of the appended claims of the present invention.

INDUSTRIAL APPLICABILITY

The following advantageous effects can be achieved by using the printed circuit board and the wiring according to the present invention.

It is possible to stabilize the scanning signal far away from the drive circuit and prevent horizontal stripes having alternate dark and bright patterns from occurring on both sides of the display panel, such that the touch display is much more stable, the display quality is improved, and the stability of the product is enhanced.

What is claimed is:

1. A gate drive circuit, comprising:
a first group of drive circuits and a second group of drive circuits, each comprising multiple stages of gate drive circuits connected in series, and each stage of the gate drive circuits comprising a shift register outputting a first gate drive signal and a touch voltage stabilizing unit coupled to the shift register, wherein the touch voltage stabilizing unit comprises:
a reference end electrically connected to a reference potential of the shift register;
a first voltage stabilizing end electrically connected to the first gate drive signal;
a second voltage stabilizing end outputting a second gate drive signal; and
a signal end electrically connected to a control signal, wherein the control signal disables the touch voltage stabilizing unit during a display period, and
wherein the control signal enables the touch voltage stabilizing unit during a touch period.

2. The gate drive circuit according to claim 1, wherein the first gate drive signal of nth stage of the first group is electrically connected to the second voltage stabilizing end of the touch voltage stabilizing unit of nth stage of the second group, where n is a positive integer.

3. The gate drive circuit according to claim 2, wherein the first gate drive signal of nth stage of the second group is electrically connected to the second voltage stabilizing end of the touch voltage stabilizing unit of (n+1)th stage of the first group, where n is a positive integer.

4. The gate drive circuit according to claim 1, wherein the first gate drive signal of nth stage of the first group is electrically connected to the second voltage stabilizing end of the touch voltage stabilizing unit of (n−1)th stage of the second group, where n is a positive integer.

5. The gate drive circuit according to claim 4, wherein the first gate drive signal of nth stage of the second group is electrically connected to the second voltage stabilizing end of the touch voltage stabilizing unit of nth stage of the first group, where n is a positive integer.

6. The gate drive circuit according to claim 1, wherein the touch voltage stabilizing unit comprises a first voltage stabilizing unit and a second voltage stabilizing unit.

7. The gate drive circuit according to claim 6, wherein the first voltage stabilizing unit and the second voltage stabilizing unit each has a first end, a second end and a control end, and
wherein the first end of the first voltage stabilizing unit is electrically connected to the reference potential, and the second end is electrically connected to the first gate drive signal.

8. The gate drive circuit according to claim 7, wherein the first end of the second voltage stabilizing unit is electrically connected to the reference potential, and the second end is electrically connected to the second gate drive signal.

9. The gate drive circuit according to claim 8, wherein the control ends of the first voltage stabilizing unit and the second voltage stabilizing unit are electrically connected to the signal end.

10. A touch display device, comprising a gate drive circuit according to claim 1.

11. A touch gate drive circuit, used for a touch display device, the touch display device has a display region, and the touch gate drivie circuit comprising:
a first shift register and a second shift register, each having a gate drive signal output end; and
a touch voltage stabilizing unit, having a first voltage stabilizing unit coupled to the gate drive signal output end of the second shift register and a second voltage stabilizing unit coupled to the gate drive signal output end of the first shift register;
wherein each of the first voltage stabilizing unit and the second voltage stabilizing unit is electrically connected to a control signal;
wherein the first shirt register and the second shift register are respectively disposed on two sides of the display region, and the first shift register and the second shift register are located at different levels of the touch gate drive circuit.

12. The touch gate drive circuit according to claim 11, wherein the first voltage stabilizing unit comprises a first switching element having a first end coupled to the gate drive signal output end of the second shift register, a second end electrically connected to a first reference voltage and a control end electrically connected to the control signal.

13. The touch gate drive circuit according to claim 12, wherein the second voltage stabilizing unit comprises a second switching element having a first end coupled to the gate drive signal output end of the first shift register, a second end electrically connected to the first reference voltage and a control end electrically connected to the control signal.

14. The touch gate drive circuit according to claim 13, wherein the second shift register is electrically connected to a clock pulse signal, and wherein the control signal is a disable signal when the clock pulse signal is an AC signal.

15. The touch gate drive circuit according to claim 13, wherein the second shift register is electrically connected to a clock pulse signal, and wherein the control signal is an enable signal when the clock pulse signal is a disabled DC signal.

\* \* \* \* \*